United States Patent
Boyd et al.

(10) Patent No.: US 6,168,169 B1
(45) Date of Patent: Jan. 2, 2001

(54) VACUUM COLLET WITH RELEASE FILAMENT

(75) Inventors: John E. Boyd, Blandon; Jonathan V. Haggar, Fleetwood; Stephanie C. Marabella, Sinking Spring; John S. Rizzo, Oley, all of PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/338,136

(22) Filed: Jun. 22, 1999

(51) Int. Cl.[7] .............................. B23B 31/06; B25B 11/00
(52) U.S. Cl. .............................. 279/3; 269/220; 279/155; 294/64.1
(58) Field of Search .......................... 279/3, 155; 269/21; 294/64.1; 228/44.7

(56) References Cited

U.S. PATENT DOCUMENTS

| | | | |
|---|---|---|---|
| 5,228,732 | * | 7/1993 | Rauscher .............................. 294/64.1 |
| 5,287,608 | * | 2/1994 | Ellis ...................................... 29/33 K |
| 5,455,605 | | 10/1995 | David et al. . |
| 5,531,331 | * | 7/1996 | Barnett ................................ 209/580 |

* cited by examiner

Primary Examiner—Steven C. Bishop
(74) Attorney, Agent, or Firm—Duane Morris & Heckscher LLP

(57) ABSTRACT

A vacuum collet includes a filament disposed in the collet for assisting in removal of components from the collet. The filament is movable in a vertical direction within the collet to gently dislodge components lodged on a bottom face of the collet. The filament may be actuated by a solenoid or pneumatic or hydraulic actuator.

14 Claims, 5 Drawing Sheets

US 6,168,169 B1

VACUUM COLLET WITH RELEASE FILAMENT

FIELD OF THE INVENTION

The present invention relates to a vacuum collet for handling small components.

DESCRIPTION OF THE RELATED ART

During the production of certain semiconductor devices, it is often necessary to handle very small components. These components must be picked up and placed on the semiconductor devices accurately to ensure proper performance of the semiconductor devices. Currently, small components which are placed on semiconductor devices are picked and placed using an automated vacuum collet device. The collet device picks up the components from a production area, moves them to an area where the semiconductor devices are located, and places the components on the semiconductor devices.

Examples of components transferred using a vacuum collet are laser bars and laser chips. Laser bars are elongate portions of laser material typically formed by cleaving a laser wafer. Laser chips are smaller portions of the laser bars, formed by cleaving the laser bar into small sections. Laser chips are used in semiconductor devices such as, for example, optical subassemblies (OSAs). An OSA uses the laser chip to project a laser beam towards a spherical lens which focuses the beam. When producing OSAs, both laser bars and laser chips must be accurately handled. The laser bars must be moved from an area where they are produced to an area where they are cleaved into a plurality of laser chips. The laser chips must then be moved from the area where they are produced to the surface of a substrate which forms the OSA. Currently, the picking and placing of the laser bars and laser chips is accomplished using a vacuum collet device.

FIGS. 1(a) and 1(b) show a conventional vacuum collet device 10 including a vacuum collet 20 and an associated component 40 (e.g. laser bar, laser chip). The collet device 10 also includes a vacuum source 30 through which a vacuum is applied to the collet 20. FIG. 1(a) shows the collet 20 with no vacuum applied, and FIG. 1(b) shows the vacuum collet 20 with vacuum applied. The vacuum created within the collet 20 draws the component 40 toward a bottom surface 21 of the collet and holds the component there as long as the vacuum remains applied. When the vacuum is deactivated, the component 40 sometimes falls away from the bottom face 21 of the collet 20 on its own. Often, however, the component 40 remains stuck to the bottom face 21 of the collet 20. When this occurs, an operator must either remove the component 40 manually or activate a gas puff through the collet 20, in the direction opposite of the vacuum, which forces the component 20 away from the collet. The mechanism for producing the gas puff is not shown in FIGS. 1(a) and (b), however, it would typically be connected to the collet 20 through the same line as the vacuum. Removal of the components 20 manually can be very time-consuming. Further, removal by a gas puff has not always proven effective. The force of the gas puff often upsets other components in the area where the component being transferred is being placed.

Thus, there exists a need for a vacuum collet which allows easy and efficient removal of components from the collet.

SUMMARY OF THE INVENTION

The present invention is an apparatus for handling components which includes a vacuum tool and a filament disposed within the vacuum tool. The filament is movable with in the vacuum tool to remove components from a face of the vacuum tool.

The above and other advantages and features of the present invention will be better understood from the following detailed description of the preferred embodiments of the invention which is provided in connection with the accompanying drawings.

DETAILED DESCRIPTION

Figure 1A:
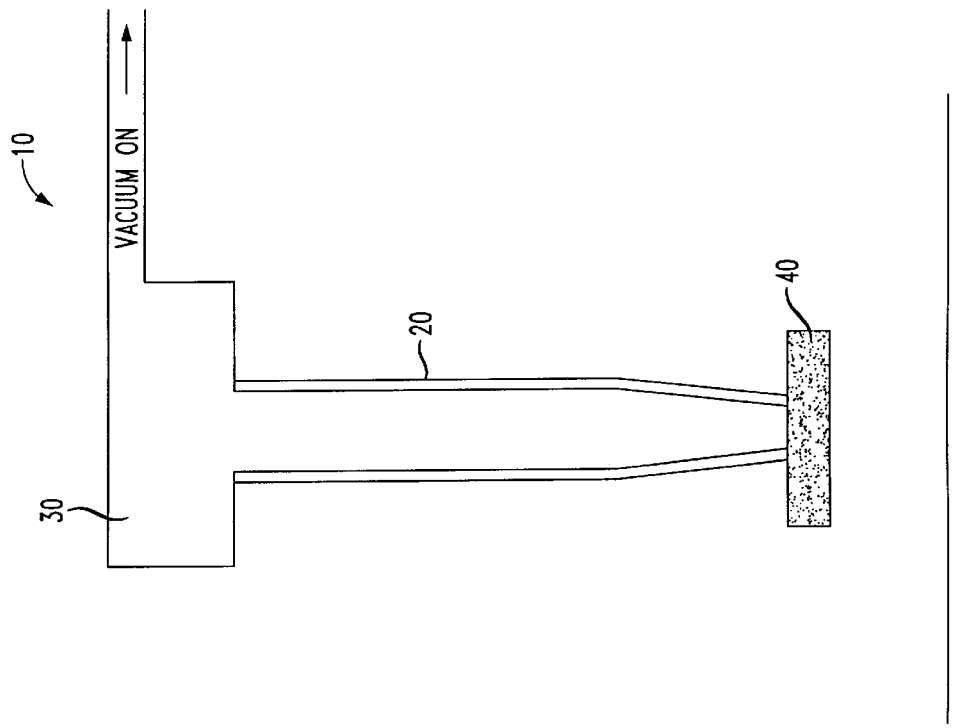
FIG. 1(a) shows a conventional vacuum collet prior to picking up a laser component.
Figure 1B:
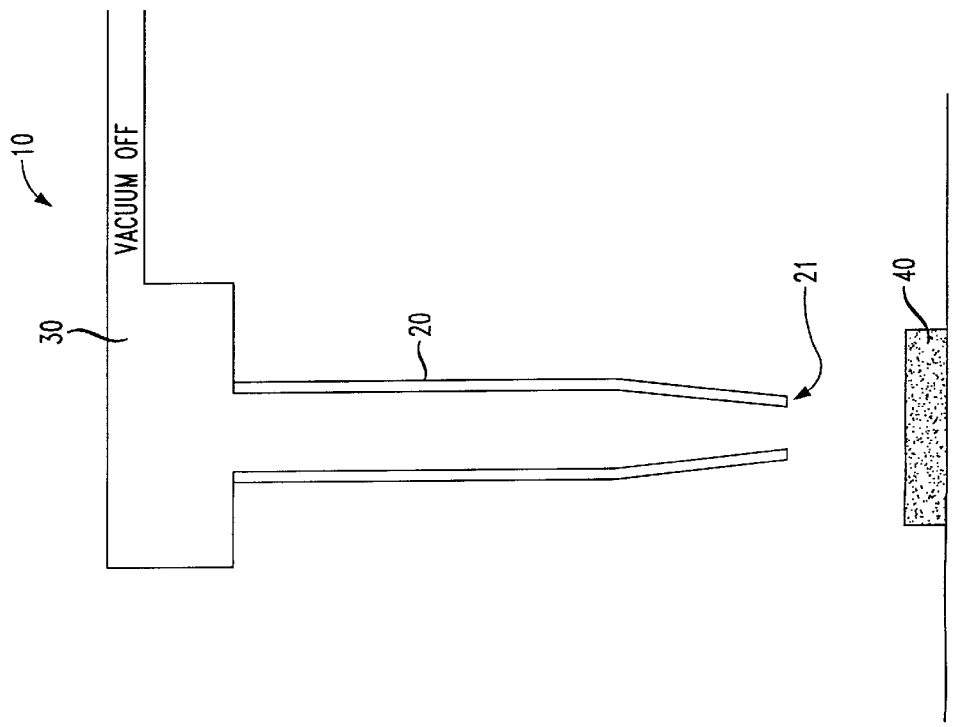
FIG. 1(b) shows the vacuum collet of FIG. 1(a) after picking up a laser component.
Figure 2A:
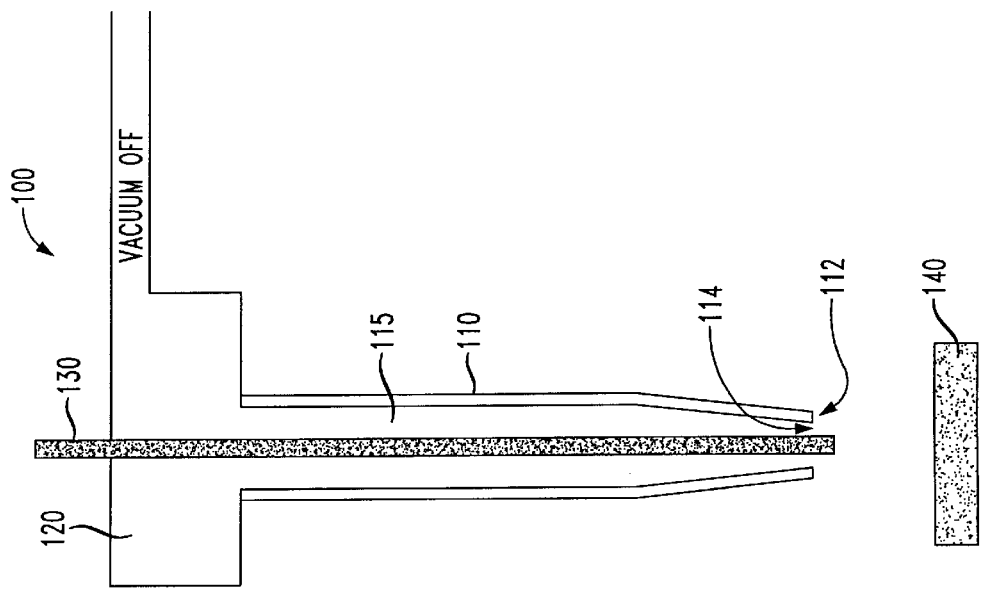
FIG. 2(a) shows a vacuum collet according to an exemplary embodiment of the present invention with a laser component attached thereto.
Figure 2B:
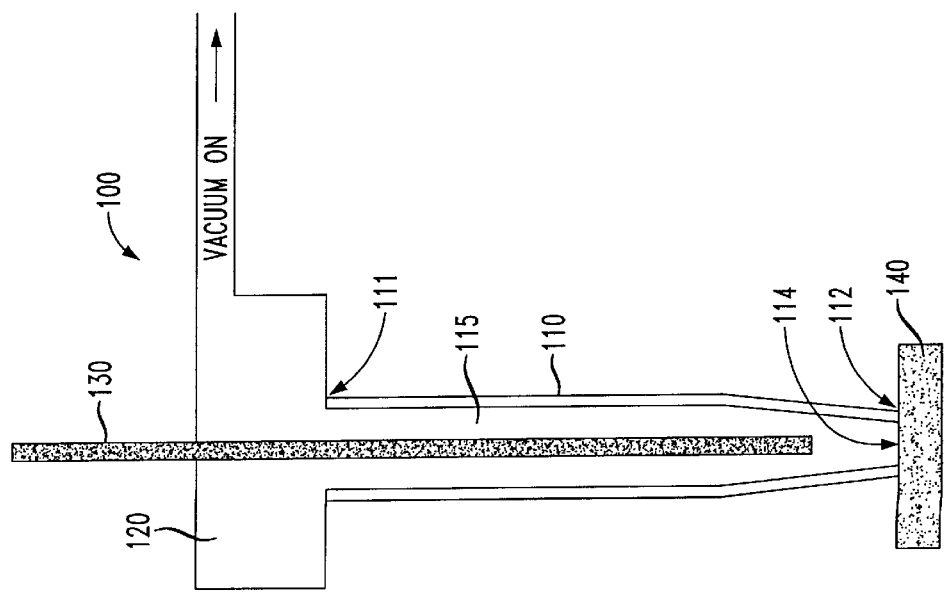
FIG. 2(b) shows the vacuum collet of FIG. 2(a) with the laser component being removed.

Referring to FIGS. 2(a) and 2(b), there is shown a vacuum collet device 100 according to the exemplary embodiment of the present invention. The collet device 100 includes a vacuum collet tube 110 with a vacuum hole 114 and a central hollowed portion 115 coupled to the vacuum hole. The collet 110 is coupled, at a top portion 111, to a vacuum source 120. The vacuum source 120 provides a vacuum to the collet 110 which draws components 140 toward a bottom face 112 of the collet. The collet 110 also includes a filament 130 disposed within the hollowed portion 115 of the collet. The filament 130 may extend through the vacuum source 120 and out of the collet device 100. The filament 130 may be disposed in substantially concentric relationship with the collet 110 as shown in FIGS. 2(a) and 2(b), or in any other suitable configuration. Alternatively, the filament 130 may exit the collet device 100 through a hole (not shown) in a side wall of the collet device. In the later case, the hole must be sealed sufficiently to maintain a vacuum, while allowing the filament 130 to slide within the collet 110.

Preferably, the diameter of the hollowed portion 115 of the collet 110 is made wider than the diameter of the filament 130, so that the filament does not substantially interfere with the vacuum through the collet 110. Outside the collet device 100, the filament 130 is coupled to an actuating mechanism, such as a solenoid mechanism 200 (See FIGS. 3(a) and 3(b)), which operates to move the filament in the vertical direction. The filament 130 is movable between a position where it is completely encased inside the collet 110, and a position where a portion thereof extends outside the collet. FIG. 2(a) shows the filament 130 retracted and the vacuum activated, so that the component 140 adheres to the bottom face 112 of the collet 110. FIG. 2(b) shows the collet after the vacuum has been deactivated and the filament has been extended. The operation of the vacuum collet device 100 is explained in more detail below. The filament 130 may be made of metal, plastic or any other suitable material known to those skilled in the art.

When handling components 140 using the collet device 100 of the exemplary embodiment of the present invention, the collet 110 is placed over the components to begin the process. In order to move the components 140 from one location to another, the vacuum source 120 is activated creating a vacuum at the bottom face 112 of the collet 110. This vacuum draws the components 140 toward the bottom face 112 of the collet 110 and retains them there. The entire collet device 100 is then moved (on a swing arm or similar device; not shown) to the position where the components 140 are to be placed. The vacuum source 120 is then deactivated, thereby restoring ambient pressure at the bottom face 112 of the collet 110. Although the deactivation of the vacuum may in some cases cause the component 140 to fall away from the collet 110, that is not always the case. Often, the component 140 remains stuck to the bottom face 112 of the collet. Thus, as soon as the vacuum is deactivated, the filament 130 moves downwardly in the collet 110 and presses against the component 140, thereby forcing the component away from the bottom face 112 of the collet 110. The vertical movement of the filament 130 may be controlled by a solenoid mechanism 200, as explained in detail below.

Figure 3A:
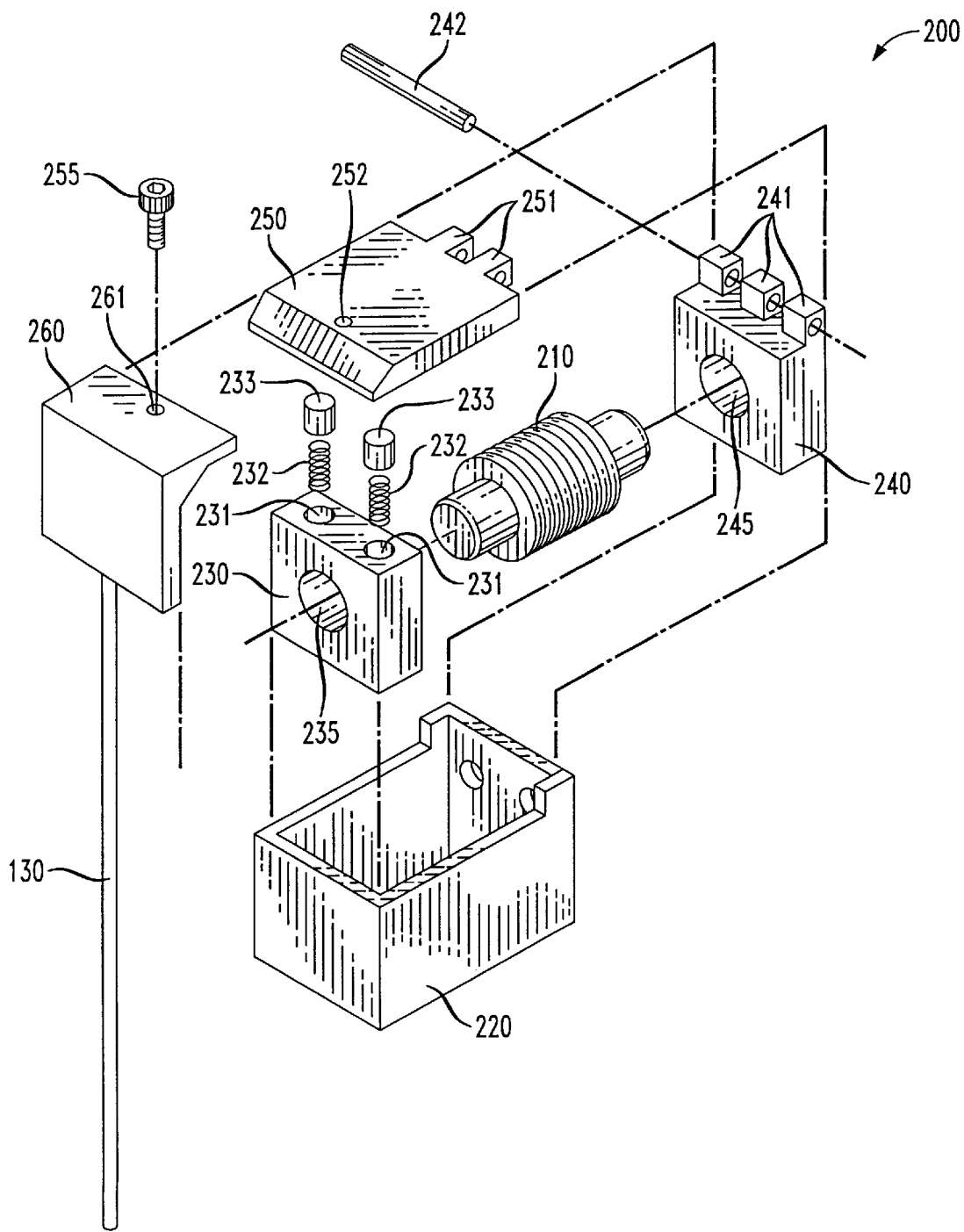
FIG. 3(a) shows an exploded view of a solenoid mechanism for use with the vacuum collet of the present invention.
Figure 3B:
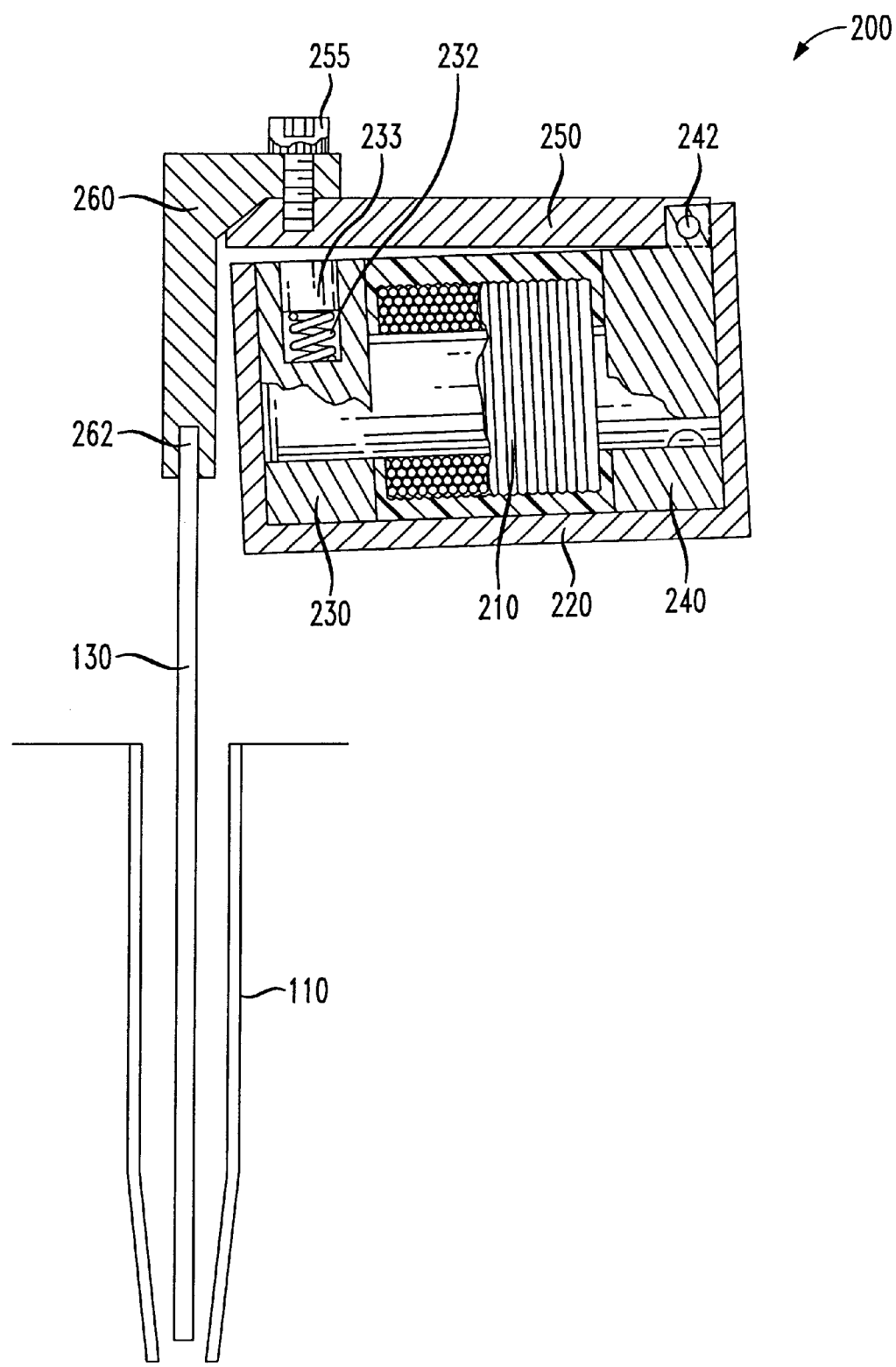
FIG. 3(b) shows a side cross-sectional view of the solenoid mechanism of FIG. 3(a).

FIGS. 3(a) and 3(b) show an exemplary solenoid mechanism 200 for accomplishing actuation of the filament 130. The solenoid mechanism 200 includes a solenoid 210 which is actuated to control the movement of the filament 130. The solenoid 210 includes control wires (not shown) coupled thereto for actuating the solenoid. Besides the solenoid 210, the mechanism 200 also includes a housing 220, front and rear support plates 230, 240, a movable plate 250, and a filament holding member 260. The front support plate 230 includes bores 231 for receiving springs 232 and dampers 233. The front support plate 230 also includes an opening 235 for receiving a portion of the solenoid 210. The rear support plate 240 includes a plurality of posts 241 with openings formed therein for receiving a dowel 242. The rear support plate 240 also includes an opening formed therein for receiving a portion of the solenoid 210. The movable plate 250 includes posts 251 with openings formed therein for cooperating with the dowel 242 and the posts 241 formed in the rear support plate 240. The movable plate 250 also includes an opening 252 for receiving a screw 255. Filament holding member 260 includes a similar opening 261 also for receiving the screw 255. The filament holding member 260 also includes a lower portion 262 for holding the filament 130 (See FIG. 3(b)). The filament may be held in the lower portion 262 by friction alone, or by some more permanent means such as glue. The mechanism 200 as assembled is shown in FIG. 3(b). As can be seen, the mechanism 200 may be disposed at a position over the vacuum collet 110 to enable operation of the collet device 100.

The operation of the solenoid mechanism 200 will next be described. During a 'pick and place' process, the filament 130 is actuated each time vacuum is deactivated. Therefore, after the vacuum is removed from the collet 110, control signals are transmitted from a controller (not shown) to the solenoid 210 on control wires (not shown) to actuate the solenoid. When the solenoid 210 becomes actuated, the movable metal plate 250 is drawn towards the housing 220 by the magnetic field created by the solenoid 210. Springs 232 and dampers 233 control the movement of the plate 250 so that the movement of the plate 250 is not erratic. The movement of the plate 250, in turn, causes the movement of filament holding member 260, which is coupled to the plate 250 by screw 255, in a downward direction. Movement of the filament holding member 260, consequently, creates a downward movement of the filament 130. The solenoid mechanism 200 causes the filament to move from its position entirely contained within the collet 110, to a position extending beyond the collet and in contact with the component 140. As explained above, the downward motion of the filament 130 causes the component to be removed from the bottom face 112 of the collet 110. After removal of the component 140, the controller (not shown) deactivates the solenoid 210 by sending the appropriate control signals on the control wires (not shown) of the solenoid. Deactivation of the solenoid 210 causes the plate 250 to move away from the housing 220, and consequently causes the filament to be retracted into the collet 110.

Figure 4:
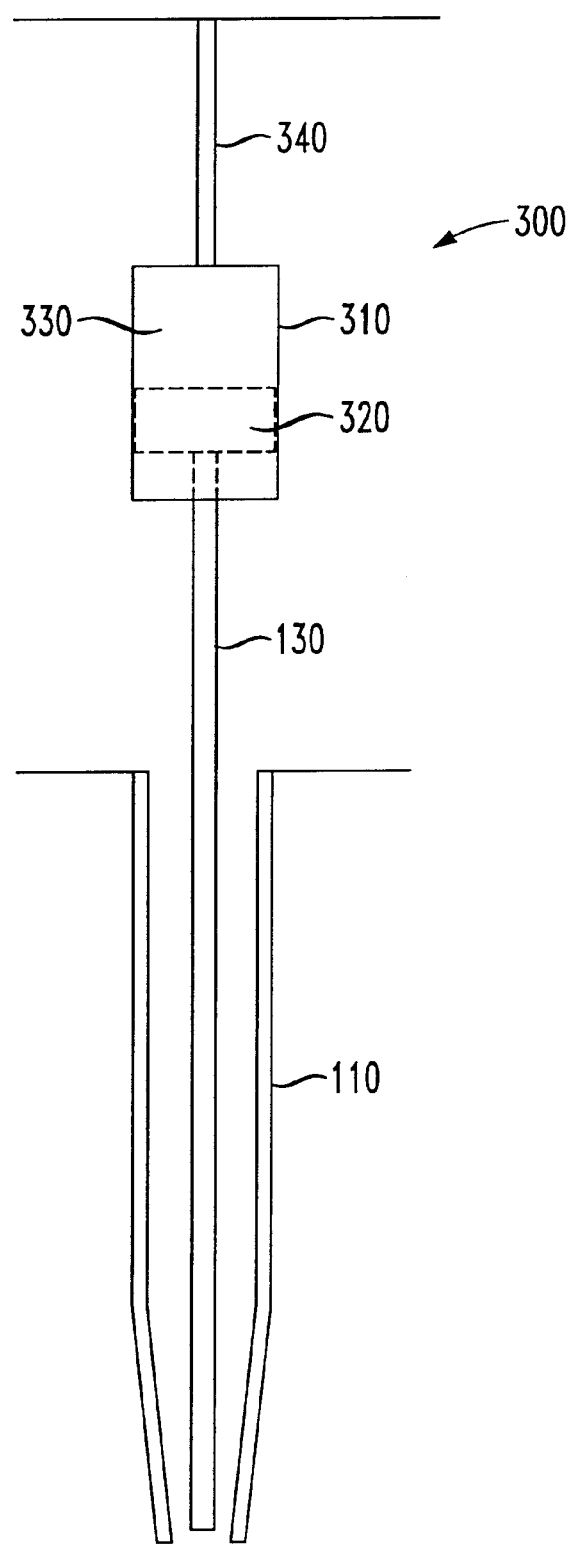
FIG. 4 shows a pneumatic/hydraulic mechanism for use with the vacuum collet of the present invention.

Although the exemplary embodiment of the collet device 100 described above is preferably used with a solenoid actuator mechanism 200, other actuating means may be used without departing from the scope of the invention. For example, a pneumatic/hydraulic actuator 300, as shown in FIG. 4, may be used in place of the solenoid mechanism 200. The pneumatic/hydraulic actuator 300 includes a piston 310 with a chamber 330 which may be filled with gas (pneumatic) or liquid (hydraulic). The gas or liquid in the chamber 330 is used to move the piston head 320. Liquid or gas is introduced to the chamber 330 over line 340. As more liquid or gas is introduced into the chamber 330, the piston head 320 is forced further down in the piston 310. The piston head 320 is coupled to the filament 130 so that compression of liquid or gas into chamber 330 causes piston head 320 to become depressed and forces the filament 130 attached thereto downwards. Thus, the filament can be moved in a vertical direction simply by applying or removing gas or liquid from the piston 310.

Thus, the exemplary embodiment of the present invention provides a vacuum collet device which removes components easily and efficiently. The vacuum collet performs the removal without the need for operator assistance, or complex gas puff equipment. Additionally, the exemplary vacuum collet may be controlled by automated control signals, thereby streamlining the process of producing and transferring components.

Although the invention has been described in terms of an exemplary embodiment, it is not limited thereto. Rather, the appended claims should be construed broadly, to include other variants and embodiments of the invention which may be made by those skilled in the art without departing from the scope and range of equivalents of the invention.

What is claimed is:

1. An apparatus for handling components comprising:
   a vacuum tool with at least one vacuum hole disposed therein;
   a filament disposed within said vacuum tool, said filament being movable relative to the vacuum tool to remove components from the vacuum tool; and
   a solenoid mechanism for moving the filament relative to the vacuum tool, said solenoid mechanism including a movable plate and a filament holding member for holding the filament.

2. The apparatus of claim 1, wherein the components comprise electronic components.

3. The apparatus of claim 1, wherein the vacuum tool is a vacuum collet.

4. The apparatus of claim 1, wherein the filament is disposed in a substantially concentric relationship with the at least one hole in the vacuum tool.

5. The apparatus of claim 3, wherein the filament is movable from a position where it is completely enclosed with the vacuum tool to a position where a portion of the filament extends outside the vacuum tool.

6. The apparatus of claim 2, wherein the electronic components are semiconductor devices.

7. The apparatus of claim 2, wherein the vacuum collet is tubular in shape and the filament lies within the tube.

8. In a method for handling components, the improvement comprising the step of:

moving a filament relative to a vacuum tool utilizing a solenoid mechanism including a movable plate and a filament holding member for holding the filament, said filament being disposed in the vacuum tool and moved into contact with a component to remove the component from the vacuum tool.

9. The method of claim 8, wherein the components comprise electronic components.

10. The method of claim 9, comprising the further steps of:

approaching the electronic component with the vacuum tool prior to the step of moving the filament;

activating the vacuum tool to attract the electronic component thereto prior to the step of moving the filament; and, deactivating the vacuum tool prior to the step of moving the filament.

11. The method of claim 9, wherein the electronic components are semiconductor devices.

12. A vacuum collet comprising:

a vacuum member with at least one vacuum hole disposed therein;

a filament disposed within said vacuum member, said filament being movable within the vacuum member to remove electronic components from the vacuum member; and a solenoid mechanism for moving the filament relative to the vacuum member, said solenoid mechanism including a movable plate and a filament holding member for holding the filament.

13. The vacuum collet of claim 12, wherein the filament is disposed in a substantially concentric relationship with the least one hole in the vacuum member.

14. The vacuum collet of claim 12, wherein the filament is movable from a position where it is completely enclosed within the vacuum member to a position where a portion of the filament extends outside the vacuum member.

* * * * *